United States Patent [19]
Hladik et al.

[11] Patent Number: 5,721,746
[45] Date of Patent: Feb. 24, 1998

[54] OPTIMAL SOFT-OUTPUT DECODER FOR TAIL-BITING TRELLIS CODES

[75] Inventors: Stephen Michael Hladik, Albany; John Bailey Anderson, Latham, both of N.Y.

[73] Assignee: General Electric Company, Schenectady, N.Y.

[21] Appl. No.: 636,742

[22] Filed: Apr. 19, 1996

[51] Int. Cl.$^6$ ............................................. H03M 13/12
[52] U.S. Cl. ..................................................... 371/43
[58] Field of Search .................................. 371/43

[56] References Cited

U.S. PATENT DOCUMENTS

| | | | |
|---|---|---|---|
| 5,349,589 | 9/1994 | Chennakeshu et al. | 371/43 |
| 5,369,671 | 11/1994 | Yehushua et al. | 375/94 |
| 5,406,570 | 4/1995 | Berrou et al. | 371/43 |
| 5,577,053 | 11/1996 | Dent | 371/37.4 |

OTHER PUBLICATIONS

L.R. Bahl, J. Cocke, F. Jelinek, and J. Raviv, "Optimal Decoding of Linear Codes for Minimizing Symbol Error Rate," IEEE Transactions on Information Theory, pp. 284–287, Mar. 1974.

J.B. Anderson and K. Balachandran, "Decision depths of convolutional codes," IEEE Trans. Information Theory, vol. IT-35, pp. 455–459, Mar. 1989.

R.V. Cox and C-E Sundberg, "An Efficient Adaptive Circular Viterbi Algorithm for Decoding Generalized Tailbiting Convolutional Codes," IEEE Transactions on Vehicular Technology, vol. 43, No. 1, pp. 57–68, Feb. 1994.

H.H. Ma and J.K. Wolf, "On tail biting convolutional codes," IEEE Transactions on Communications, vol. 34, No., pp. 104–111, Feb. 1986.

Q. Wang and V.K. Bhargava, "An efficient maximum likelihood decoding algorithm for generalized tailbiting convolutional codes including quasicyclic codes," IEEE Transactions on Communications, vol. 37, No. 8, pp. 875–879, Aug. 1989.

J.B. Anderson and Seshadri Mohan, "Source and Channel Coding," pp. 216 and 336–342.

*Primary Examiner*—Stephen M. Baker
*Attorney, Agent, or Firm*—Jill M. Breedlove; Marvin Snyder

[57] ABSTRACT

A circular MAP decoder for error-correcting trellis codes that employ tail biting produces soft-decision outputs provides an estimate of the probabilities of the states in the first stage of the trellis, which probabilities replace the a priori knowledge of the starting state in a conventional MAP decoder. The circular MAP decoder provides the initial state probability distribution in either of two ways. The first involves a solution to an eigenvalue problem for which the resulting eigenvector is the desired initial state probability distribution; with knowledge of the starting state, the circular MAP decoder performs the rest of the decoding according to the MAP decoding algorithm. The second is based on a recursion for which the iterations converge to a starting state distribution. After sufficient iterations, a state on the circular sequence of states is known with high probability, and the circular MAP decoder performs the rest of the decoding according to the MAP decoding algorithm.

25 Claims, 8 Drawing Sheets

OPTIMAL SOFT-OUTPUT DECODER FOR TAIL-BITING TRELLIS CODES

FIELD OF THE INVENTION

The present invention relates generally to decoders for error-correcting codes and, more particularly, to a decoder for tail-biting trellis codes.

BACKGROUND OF THE INVENTION

The Viterbi algorithm (VA) is a maximum-likelihood decoding method which determines the most probable data sequence or word for the case of additive white Gaussian channel noise; i.e., it minimizes the probability of a decoded word error. This scheme is essentially a dynamic program to find the path through the code trellis that is closest to the received sequence of channel outputs.

On the other hand, the symbol or bit error probability is minimized by using a so-called maximum a posteriori (MAP) decoder. The MAP decoder was first formally described by Bahl, Cocke, Jelinek and Raviv (hence the alternative name "the BCJR algorithm") in "Optimal Decoding of Linear codes for Minimizing Symbol Error Rate," *IEEE Transactions on Information Theory*, pp. 284–287, March 1974. The term MAP decoder, or BCJR Algorithm, is taken herein to mean a data decoder that puts out a probability distribution of the states at each stage of the trellis and that may also take in a priori knowledge of the data bit statistics. The MAP decoder is optimal in the sense that it produces these state probabilities, or "soft output," with perfect accuracy while other, albeit simpler, decoders exist that can produce only an approximation to these probabilities. Variants of the algorithm put out related information, such as the probability distribution of the data symbols at each stage, or the distribution of the encoder output symbols at each stage.

A MAP decoder requires that the starting state in a trellis code transmission be known, and in some applications, that the ending state be known as well. Unfortunately, therefore, a MAP decoder cannot be used for decoding trellis codes which employ tail-biting, i.e., codes for which the starting and ending states of the encoder cannot be known in advance. In particular, a trellis code transmission is said to employ "tail biting" when the starting state of the encoder is identical to the eventual ending state for a given block of input bits. It is straightforward for a feed-forward encoder to know from the data bits what the ending state will be; it is merely the last km bits of the message block, where k is the number of bits per encoder input symbol and m is the code's memory. A tail-biting encoder is to be distinguished from an ordinary encoder in which the starting state is a pre-arranged state, usually the all-zero state. Ordinary encoders may also terminate in a pre-arranged state by appending a "tail" of km bits to the input message block. What distinguishes a tail-biting decoder is that it must estimate the encoder's starting state in addition to its other functions. Since a tail-biting encoder has a cylindrical trellis, a codeword generated by such an encoder may be visualized as a circle of symbols. The decoder must start from some arbitrary point on the circle, achieve a measure of synchronization, and then decode the data bits.

A number of tail-biting decoders have been proposed that are analogs to the VA decoder;, that is, they produce a maximum likelihood estimate of the circular trellis codeword. A soft-output decoder, on the other hand, would have to estimate the state probabilities around the cylindrical trellis, and no such decoder is presently available. In particular, as explained hereinabove, a soft-output MAP decoder requires that the starting state in the trellis be known, and in some applications, that the ending state be known as well. Hence, application of the MAP decoder is limited to ordinary codes without tail biting which, in turn, has precluded obtaining the advantages of tail biting in improving the error correction performance of systems that transmit short data blocks (e.g., in packet transmission) when true, soft output is needed.

Accordingly, it is desirable to provide an accurate, low-complexity, soft-output decoder for tail-biting trellis codes.

SUMMARY OF THE INVENTION

In accordance with the present invention, a circular MAP decoder for error-correcting trellis codes that employ tail biting produces soft-decision outputs. The circular MAP decoder provides an estimate of the probabilities of the states in the first stage of the trellis, which probabilities replace the a priori knowledge of the starting state in a conventional MAP decoder. According to the present invention, the circular MAP decoder provides the initial state probability distribution in either of two ways. The first involves a solution to an eigenvalue problem for which the resulting eigenvector is the desired initial state probability distribution; with knowledge of the starting state, the circular MAP decoder performs the rest of the decoding according to the MAP decoding algorithm. The second is based on a recursion for which the iterations converge to a starting state distribution. After sufficient iterations, a state on the circular sequence of states is known with high probability, and the circular MAP decoder performs the rest of the decoding according to the MAP decoding algorithm.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
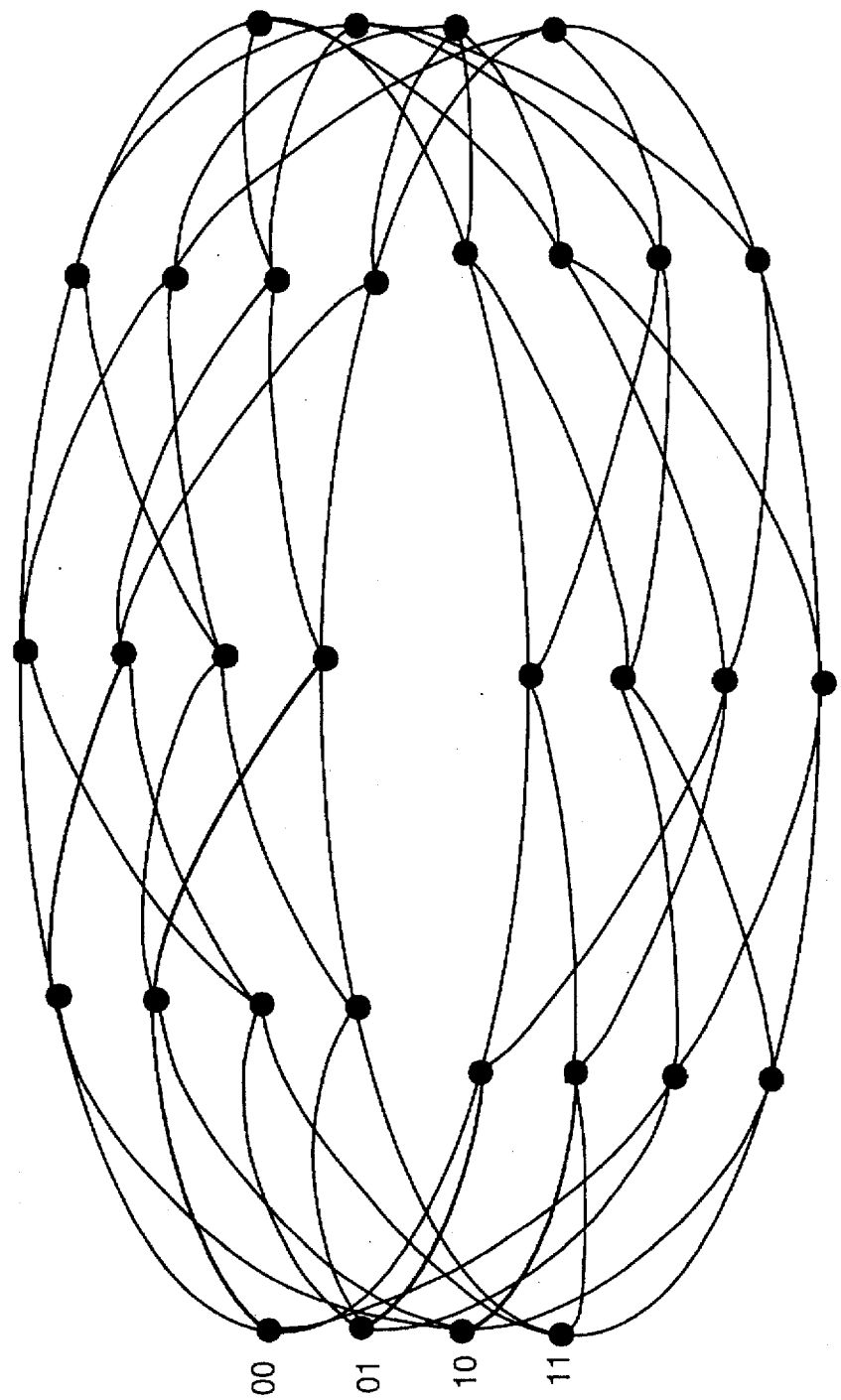
FIG. 1 illustrates a cylindrical trellis for a four-state tail-biting trellis code having binary input symbols.

A tail-biting encoder has a cylindrical trellis; therefore, a codeword generated by such an encoder may be visualized as a circle of symbols. FIG. 1 illustrates an examplary cylindrical trellis for a tail-biting trellis encoder having four states and binary input symbols. The lack of a priori knowledge regarding the initial state of the encoder in the case of such tail-biting trellis codes degrades the reliability of decoding via the standard MAP (or BCJR) decoding algorithm for the fast portion of a received message.

Figure 2:
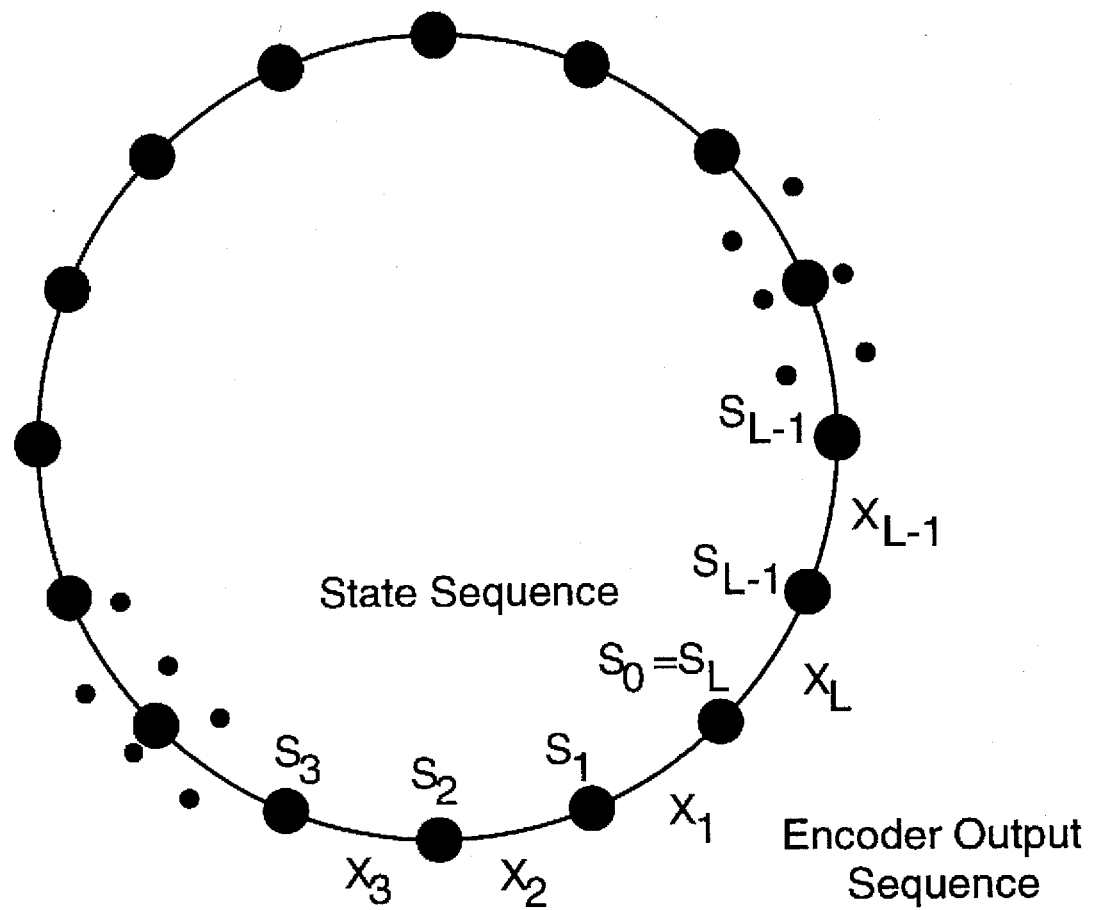
FIG. 2 illustrates circular encoder state and encoder output sequences for a tail-biting trellis code.

The encoder output sequence for a tail-biting trellis code forms a circular pattern as depicted in FIG. 2. The encoder states are viewed as being arranged around a circle. If $S_0$ is one of these states, the encoder starts from shift register state $S_0$ at that time $t_0$ in the encoding process and, after traversing around the circle in a series of state transitions, ends in the same state $S_0$. A decoder that works with the encoded sequence as a circle in this way with each encoder state leading to the next one around the circle is a tail-biting or circular decoder.

In accordance with the present invention, a circular MAP decoder for error-correcting trellis codes that employ tail biting produces soft-decision outputs. By way of contrast, in a conventional MAP decoder, the decoder is given a starting state, or trellis node; it then decodes the encoder trellis path that descends from this state. In a tail-biting decoder, however, the decoder must first identify a state in the encoder state sequence, and only then can it begin decoding. The circular MAP decoder according to the present invention provides an estimate of the probabilities of the states in the first stage of the trellis, which probabilities replace the a priori knowledge of the starting state in a conventional MAP decoder. The circular MAP decoder of the present invention provides the initial state probability distribution in either of two ways. The first involves a solution to an eigenvalue problem for which the resulting eigenvector is the desired initial state probability distribution; with knowledge of the starting state, the circular MAP decoder performs the rest of the decoding according to the conventional MAP (or BCJR) decoding algorithm. The second is based on a certain recursion for which the iterations converge to a starting state distribution. After sufficient iterations, a state on the circular sequence of states is known with high probability, and the circular MAP decoder performs the rest of the decoding according to the conventional MAP (or BCJR) decoding algorithm.

The objective of the conventional MAP (or BCJR) decoding algorithm is to find the conditional probabilities:

P{state m at time t/receive channel outputs $y_1, \ldots, y_L$}.

The term L in this expression represents the length of the data block in units of the number of encoder symbols. (The encoder for an (n, k) code operates on k-bit input symbols to generate n-bit output symbols.) The term $y_t$ is the channel output (symbol) at time t.

The MAP decoding algorithm actually first finds the probabilities:

$$\lambda_t(m) = P\{S_t=m; Y_1^L\} \qquad (1)$$

that is, the joint probability that the encoder state at time t, $S_t$, is m and the set of channel outputs $Y_1^L = \{y_1, \ldots, y_L\}$ is received. These are the desired probabilities multiplied by a constant ($P\{Y_1^L\}$, the probability of receiving the set of channel outputs $\{y_1, \ldots, y_L\}$).

Now define the elements of a matrix $\gamma_t$ by $$\gamma_t(ij) = P\{\text{state j at time t; } y_t/\text{state i at time t-1}\}$$

The matrix $\gamma_t$ is calculated as a function of the channel transition probability $R(Y_t, X)$, the probability $p_t(m/m')$ that the encoder makes a transition from state m' to m at time t, and the probability $q_t(X/m',m)$ that the encoder's output symbol is X given that the previous encoder state is m' and the present encoder state is m. In particular, each element of $\gamma_t$ t is calculated by summing over all possible encoder outputs X as follows:

$$\gamma_t(m',m) = \sum_X p_t(m/m')q_t(X/m',m)R(Y_t,X). \qquad (2)$$

The MAP decoder calculates L of these matrices, one for each trellis stage. They are formed from the received channel output symbols and the nature of the trellis branches for a given code.

Next define the M joint probability elements of a row vector $\alpha_t$ by $$\alpha_t(j) = P\{\text{state j at time t; } y_1, \ldots y_t\} \qquad (3)$$

and the M conditional probability elements of a column vector $\beta_t$ by $$\beta_t(j) = P\{y_{t+1}, \ldots y_L/\text{state j at time t}\} \qquad (4)$$

for $j=0,1, \ldots, (M-1)$ where M is the number of encoder states. (Note that matrices and vectors are denoted herein by using boldface type.)

The steps of the MAP decoding (or BCJR) algorithm are as follows:

(i) Calculate $\alpha_1, \ldots, \alpha_L$ by the forward recursion:

$$\alpha_t = \alpha_{t-1}\gamma_t, t=1, \ldots, L \qquad (5)$$

(ii) Calculate $\beta_1, \ldots, \beta_{L-1}$ by the backward recursion:

$$\beta_t = \gamma_{t+1} \beta_{t+1}, t=L-1, \ldots, 1 \qquad (6)$$

(iii) Calculate the elements of $\lambda_t$ by:

$$\lambda_t(i) = \alpha_t(i) \beta_t(i), \text{ all i, } t=1, \ldots, L \qquad (7)$$

(iv) Find related quantifies as needed. For example, let $A_t^j$ be the set of states $S_t = \{S_t^1, S_t^2, \ldots, S_t^{km}\}$ such that the $j^{th}$ element of $S_t$, $S_t^j$, is equal to zero. For a conventional non-recursive trellis code, $S_t^j = d_t^j$, the $j^{th}$ data bit at time t. Therefore, the decoder's soft-decision output is $$P\{d_t^j = 0/Y_1^L\} = \frac{1}{P\{Y_1^L\}} \sum_{S_t \in A_t^j} \lambda_t(m)$$

where $$P\{Y_1^L\} = \sum_m \lambda_L(m)$$

and m is the index that corresponds to a state $S_t$.

The decoder's hard-decision or decoded bit output is obtained by applying $P\{d_t^j=0/Y_1^L\}$ to the following decision rule:

$$\hat{d}_t^j = 0$$
$$P\{d_t^j = 0/Y_1^L\} \underset{<}{\overset{>}{=}} \frac{1}{2};$$
$$\hat{d}_t^j = 1$$

That is, if $P\{d_t^j=0/Y_1^L\} > \frac{1}{2}$ then $\hat{a}_{thu\ j}=0$; if $P\{d_t^j=0/Y_1^L\} < \frac{1}{2}$, then $\hat{a}_t^j=1$; otherwise, randomly assign $d_t^j$ the value 0 or 1.

As another example of a related quantity for step (iv) hereinabove, the matrix of probabilities $\sigma_t$ comprises elements defined as follows:

$$\sigma_t(i,j) = \{S_{t-1}=i;\ S_t=j;\ Y_1^L\} = \alpha_{t-1}(i)\gamma_t(i,j)\ \beta_t(j)$$

These probabilities are useful when it is desired to determine the a posteriori probability of the encoder output bits.

In the standard application of the MAP decoding algorithm, the forward recursion is initialized by the vector $\alpha_0=(1,0,\ldots 0)$, and the backward recursion is initialized by $\beta_L=(1,0,\ldots 0)^T$ These initial conditions are based on assumptions that the encoder's initial state $S_0=0$ and its ending state $S_L=0$.

In accordance with one embodiment of the present invention, the circular MAP decoder determines the initial state probability distribution by solving an eigenvalue problem as follows. Let $\alpha_t$, $\beta_t$, $\gamma_t$, and $\lambda_t$ be as before, but take the initial $\alpha_0$ and $\beta_L$ as follows:

Set $\beta_L$ to the column vector $(111\ldots 1)^T$.
Let $\alpha_0$ be an unknown (vector) variable.
Then (i) Calculate $\gamma_t$ for $t=1, 2 \ldots L$ according to equation (2).

(ii) Find the largest eigenvalue of the matrix product $\gamma_1 \gamma_2 \ldots \gamma_L$. Normalize the corresponding eigenvector so that its components sum to unity. This vector is the solution for $\alpha_0$. The eigenvalue is $P\{Y_1^L\}$.

(iii) Form the succeeding $\alpha_t$ by the forward recursion set forth in equation (5).

(iv) Starting from $\beta_L$, initialized as above, form the $\beta_t$ by the backward recursion set forth in equation (6).

(v) Form the $\lambda_t$ as in (7), as well as other desired variables, such as, for example, the soft-decision output $P\{d_t^j=0/Y_1^L\}$ or the matrix of probabilities $\sigma_t$, described hereinabove.

The inventors have shown that the unknown variable $\alpha_0$ satisfies the matrix equation $$\alpha_0 = \frac{\alpha_0 \Gamma_1 \Gamma_2 \ldots \Gamma_L}{P\{Y_1^L\}}.$$

From the fact that this formula expresses a relationship among probabilities, we know that the product of $\gamma_t$ matrices on the right has largest eigenvalue equal to $P\{Y_1^L\}$, and that the corresponding eigenvector must be a probability vector.

With the initial $\beta_L=(111\ldots 1)^T$, equation (6) gives $\beta_{L-1}$. Thus, repeated applications of this backward recursion give all the $\beta_t$. Once if $\alpha_0$ is known and $\beta_L$ is set, all computations in the circular MAP decoder of the present invention follow the conventional MAP decoding algorithm.

Figure 3:
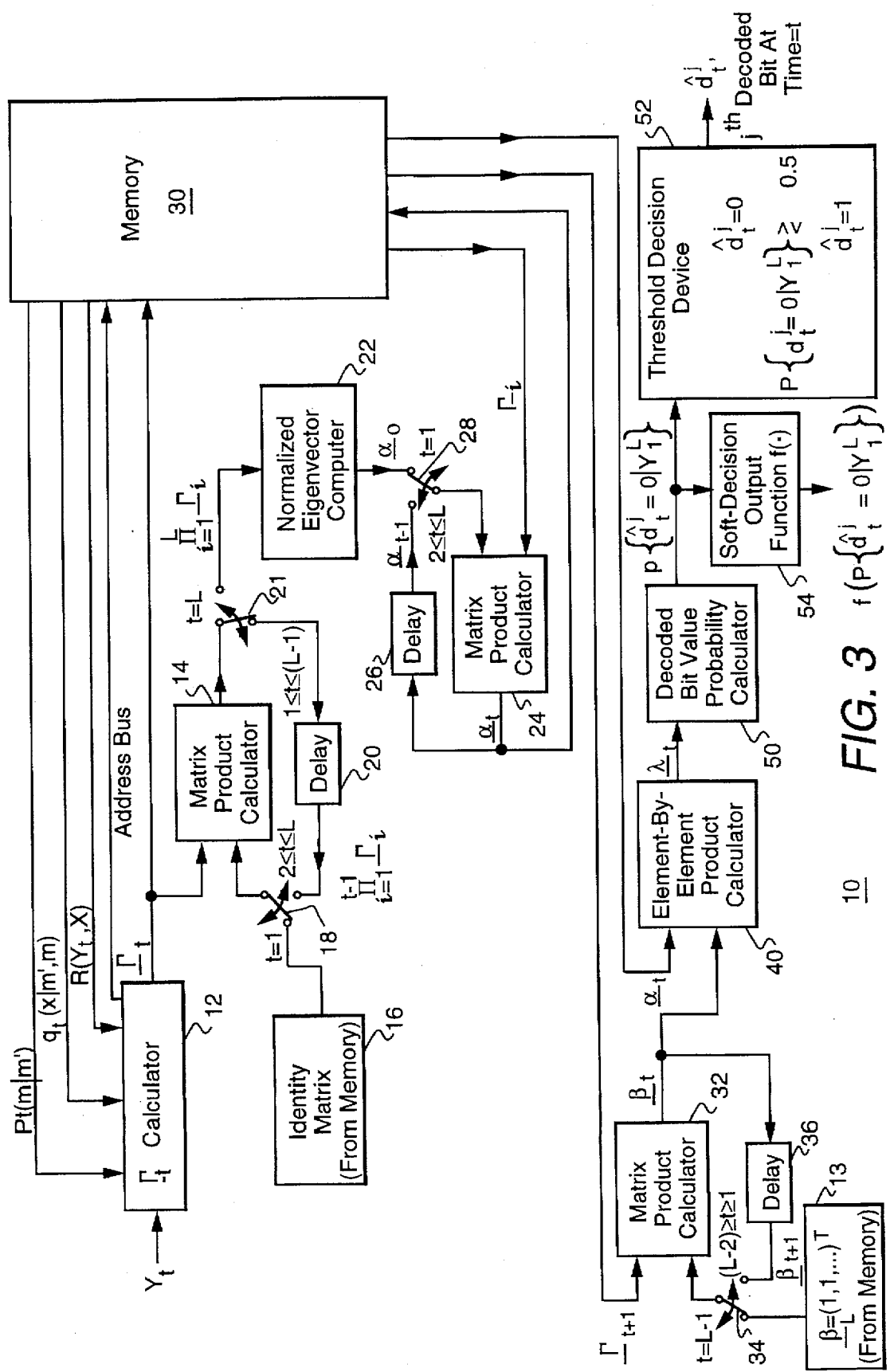
FIG. 3 is a simplified block diagram illustrating one embodiment of a circular MAP decoder in accordance with the present invention.

FIG. 3 is a simplified block diagram illustrating a circular MAP decoder 10 for decoding an error-correcting tail-biting trellis code in accordance with the eigenvector method described hereinabove. Decoder 10 comprises a $\gamma_t$ calculator 12 which calculates $\gamma_t$ as a function of the channel output $y_t$. The $\gamma_t$ calculator receives as inputs the following from a memory 30: the channel transition probability $R(Y_t, X)$, the probability $p_t(m/m')$ that the encoder makes a transition from state m' to m at time t, and the probability $q_t(X/m',m)$ that the encoder's output symbol is X given that the previous encoder state is m' and the present encoder state is m. The $\gamma_t$ calculator calculates each element of $\gamma_t$ by summing over all possible encoder outputs X in accordance with equation (2).

The calculated values of $\gamma_t$ are provided to a matrix product calculator 14 to form the matrix product $\gamma_1\gamma_2\ldots\gamma_L$ using an identity matrix 16, e.g., received from memory, a switch 18 and a delay circuit 20. At time t=1, the identity matrix is applied as one input to the matrix product calculator. For each subsequent time from t=2 to t=L, the matrix product $$\prod_{i=1}^{t-1} \Gamma_i$$

gets fed back via the delay circuit to the matrix product calculator. Then, at time t=L, the resulting matrix product is provided via a switch 21 to a normalized eigenvector computer 22 which calculates the normalized eigenvector corresponding to the largest eigenvalue of the matrix product input thereto. With $\alpha_0$ thus initialized, i.e., as this normalized eigenvector, the succeeding $\alpha_t$ vectors are determined recursively according to equation (5) in a matrix product calculator 24 using a delay 26 and switch 28 circuitry, as shown. Appropriate values of $\gamma_t$ are retrieved from a memory 30, and the resulting $\alpha_t$ are then stored in memory 30.

The values of $\beta_t$ are determined in a matrix product calculator 32 using a switch 34 and delay 36 circuitry according to equation (6). Then, the probabilities $\lambda_t$ are calculated from the values of $\alpha_t$ and $\beta_t$ in an element-by-element product calculator 40 according to equation (7). The values of $\lambda_t$ are provided to a decoded bit value probability calculator 50 which determines the probability that the $j^{th}$ decoded bit at time t, $d_t$, equals zero. This probability is provided to a threshold decision device 52 which implements the following decision rule: If the probability from calculator 50 is greater than $\frac{1}{2}$, then decide that the decoded bit is zero; if the probability is less than $\frac{1}{2}$, then decide that the decoded bit is one; if it equals $\frac{1}{2}$, then the decoded bit is randomly assigned the value 0 or 1. The output of the threshold decision device is the decoder's output bit at time t.

The probability that the decoded bit equals zero ($P\{d_t^j=0\}$) is also shown in FIG. 3 as being provided to a soft output function block 54 for providing a function of the probability, i.e., $f(P\{d_t^j=0\})$, such as, for example, the $$\text{likelihood ratio} = \frac{1-P\{d_t^j=0\}}{P\{d_t^j=0\}}$$

as the decoder's soft-decision output. Another useful function of $P\{d_t^j=0\}$ is the $$\text{log likelihood ratio} = \log\left\{\frac{1-P\{d_t^j=0\}}{P\{d_t^j=0\}}\right\}.$$

Alternatively, a useful function for block 54 may simply be the identity function so that the soft output is just $P\{d_t^j=0\}$.

A circular MAP decoder according to an alternative embodiment of the present invention determines the state probability distributions by a recursion method. In particular, in one embodiment (the dynamic convergence method), the recursion continues until decoder convergence is detected. In this recursion (or dynamic convergence) method, steps (ii) and (iii) of the eigenvector method described hereinabove are replaced as follows:

(ii.a) Starting with an initial $\alpha_0$ equal to $(1/M, \ldots, 1/M)$, where M is the number of states in the trellis, calculate the forward recursion L times. Normalize the results so that the elements of each new $\alpha_t$ sum to unity. Retain all L $\alpha_t$ vectors.

(ii.b) Let $\alpha_0$ equal $\alpha_L$ from the previous step and, starting at t=1, calculate the first $L_{w_{min}}$ $\alpha_t$ probability vectors again.

That is, calculate $$\alpha_t(m) = \sum_{i=0}^{M-1} \alpha_{t-1}(i)\gamma_t(i,m)$$

for m=0, 1, ..., M−1 and t=1,2, ..., $L_{w_{min}}$ where $L_{w_{min}}$ is a suitable minimum number of trellis stages. Normalize as before. Retain only the most recent set of L $\alpha$'s found by the recursion in steps (ii.a) and (ii.b) and the $$\alpha_{L_{w_{min}}}$$

found previously in step (ii.a).

(ii.c) Compare $$\alpha_{L_{w_{min}}}$$

from step (ii.b) to the previously found set from step (ii.a). If the M corresponding elements of the new and old $$\alpha_{L_{w_{min}}}$$

are within a tolerance range, proceed to step (iv) set forth hereinabove. Otherwise, continue to step (ii.d).

(ii.d) Let t=t+1 and calculate $\alpha_t=\alpha_{t-1}\gamma_t$. Normalize as before. Retain only the most recent set of L $\alpha$'s calculated and the $\alpha_t$ found previously in step (ii.a).

(ii.e) Compare the new $\alpha_t$'s to the previously found set. If the M new and old $\alpha_t$'s are within a tolerance range, proceed to step (iv). Otherwise, continue with step (ii.d) if the two most recent vectors do not agree to within the tolerance range and if the number of recursions does not exceed a specified maximum (typically 2L); proceeding to step (iv) otherwise.

Figure 4:
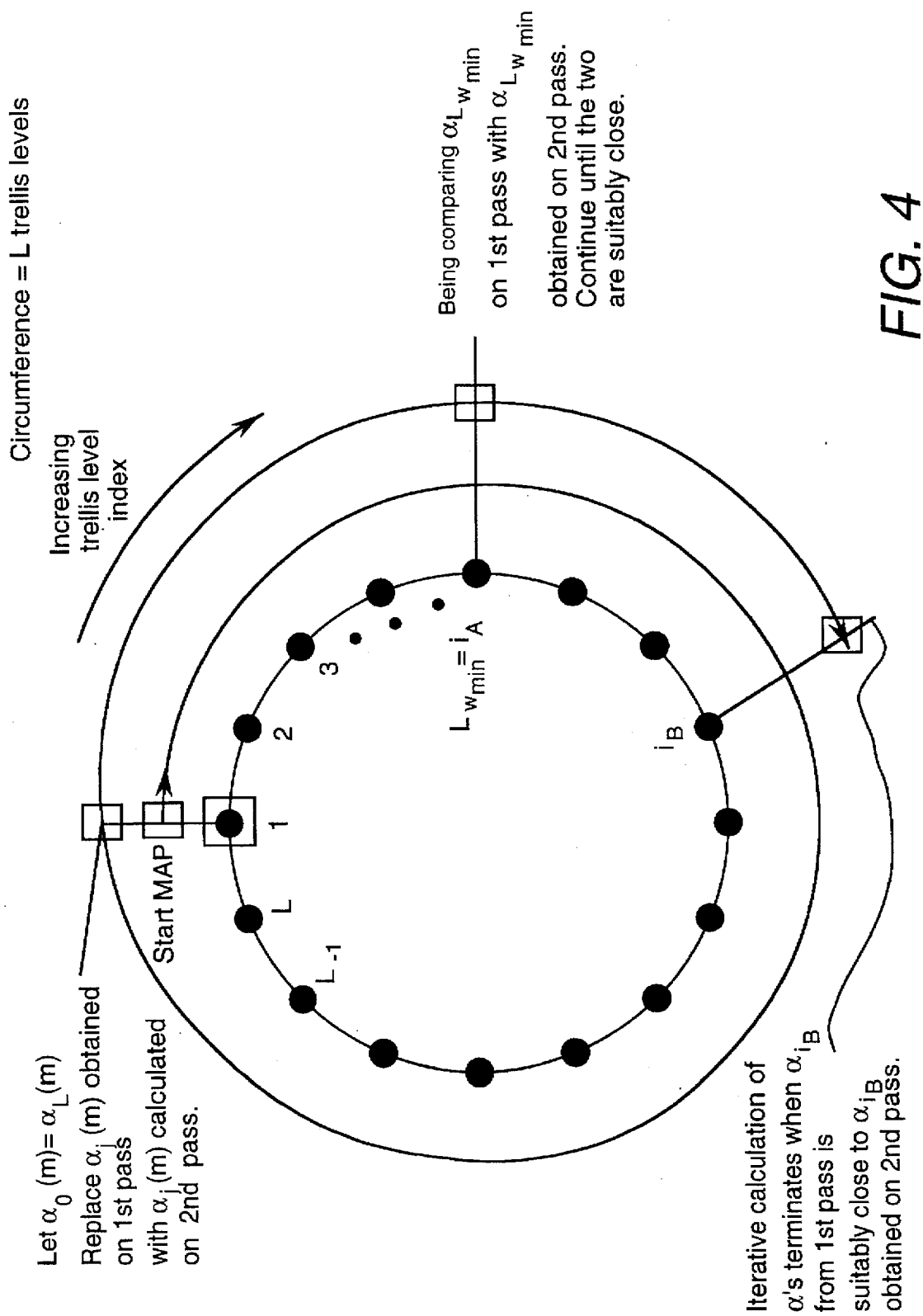
FIG. 4 illustrates a time line for a circular MAP decoder in accordance with the present invention.

The circular "time line" of FIG. 4 summarizes the process of steps (ii.a)14 (ii.e) above for calculating the $\alpha_t$ for t=1, 2, ..., L for the circular MAP decoder, resulting in an estimation of all L $\alpha_t$ vectors. This method then continues with steps (iv) and (v) given hereinabove with respect to the eigenvector method to produce the soft-decision outputs and decoded output bits of the circular MAP decoder.

In the circular MAP decoder, note that $\alpha_0$ is initialized as $\alpha_0=(1/M, \ldots, 1/M)$ since the initial encoder state is unknown. It is also assumed that all M initial states are equally likely. (If this is not true, the initial values $\alpha_0(m)$ can be assigned according to any a priori knowledge regarding the probabilities of the initial starting state. Thus, the decoder described herein is also advantageously applicable to partial tail-biting trellis codes.)

An explanation of the operation of the circular MAP decoder according to the present invention is facilitated by considering the definition of $\alpha_t(m)$. The term $\alpha_t(m)$ is the joint probability that the encoder is in state m at time t and that the decoder has observed the symbol sequence $\{y_1, \ldots, y_t\}$ from the channel. Examination of equation (5), the recursive calculation of $\alpha_t$, reveals the effect of not knowing the initial state of the tail-biting trellis encoder. It is evident from equation (5) that not knowing the initial state of the tail-biting trellis encoder will bias $\alpha_1(m)$ in the sense that the computed joint probability that the encoder is in state m at time t=1 and that the decoder has observed the the channel output $y_1$ will be greater than is actually the case for descendents of incorrect initial states and less than is actually the case for descendents of the correct initial state. While this bias will tend to propagate due the recursive calculation of $\alpha_t(m)$, it also fortunately tends to decrease with the observation of more channel output symbols. Therefore, if the message block length L is large enough, the $\alpha_L(m)$ will be much more accurate than the $\alpha_0(m)$ since the decoder now has the benefit of observing the entire sequence of symbols from the channel. The $\alpha_L(m)$ may now be used as the $\alpha_0(m)$ in a second decoding iteration as indicated in step (ii.b) above.

Advantageously, the recursive (or dynamic convergence) method according to the present invention compares the values obtained from each iteration and terminates the recursive calculation of $\alpha_t$ when convergence is detected. Hence, this technique reduces the number of calculations required as it is often not necessary to recompute $\alpha_t$ for all L trellis stages.

In another alternative embodiment of the present invention, a circular MAP decoder using the recursion method described hereinabove is modified so that the decoder only needs to process a predetermined, fixed number of trellis stages for a second time, that is, a predetermined wrap depth. This is advantageous for implementation purposes because the number of computations required for decoding is the same for every encoded message block. Consequently, hardware and software complexities are reduced.

The wrap depth described herein is found in the context of a bounded distance decoder which is a decoder that corrects any combination of e or fewer errors occurring in the observation length $L_{obs}$ trellis levels. This extends directly to decoders built to achieve other criteria, such as the minimization of decoder error probability.

One way to estimate the required wrap depth for MAP decoding of a tail-biting convolutional cede is to determine it from hardware or software experimentation, requiring that a circular MAP decoder with a variable wrap depth be implemented and experiments be conducted to measure the decoded bit error rate versus $E_b/N_o$ for successively increasing wrap depths. The minimum decoder wrap depth that provides the minimum probability of decoded bit error for a specified $E_b/N_o$ is found when further increases in wrap depth do not decrease the error probability.

If a decoded bit error rate that is greater than the minimum achievable at a specified $E_b/N_o$ is tolerable, it is possible to reduce the required number of trellis stages processed by the circular MAP decoder. In particular, the wrap depth search described hereinabove may simply be terminated when the desired average probability of bit error is obtained.

Another way to determine the wrap depth for a given code is by using the code's distance properties. To this end, it is necessary to define two distinct decoder decision depths. As used herein, the term "correct path" refers to the sequence of states or a path through the trellis that results from encoding a block of data bits. The term "incorrect subset of a node" refers to the set of all incorrect (trellis) branches out of a correct path node and their descendents. Both the decision depths defined below depend on the convolutional encoder.

(For illustrative purposes, this embodiment of the present invention is described herein with reference to a convolutional encoder, however, it is to be understood that the present invention is not limited to convolutional codes.)

The decision depths are defined as follows:

(i) Define the forward decision depth for e-error correction, LF(e), to be the first depth in the trellis at which all paths in the incorrect subset of a correct path initial node, whether later merging to the correct path or not, lie more than a Hamming distance 2e from the correct path. The significance of LF(e) is that if there are e or fewer errors forward of the initial node, and encoding is known to have begun there, then the decoder must decode correctly. A formal tabulation of forward decision depths for convolutional codes was provided by J. B. Anderson and K. Balachandran in "Decision Depths of Convolutional Codes", *IEEE Transactions on Information Theory*, vol. IT-35, pp. 455–59, March 1989. A number of properties of LF(e) are disclosed in this reference and also by J. B. Anderson and S. Mohan in *Source and Channel Coding—An Algorithmic Approach*, Kluwer Academic Publishers, Norwell, Mass., 1991. Chief among these properties is that a simple linear relation exists between LF and e; for example, with rate ½ codes, LF is approximately 9.08e.

(ii) Next define the unmerged decision depth for e-error correction, LU(e), to be the first depth in the trellis at which all paths in the trellis that never touch the correct path lie more than a Hamming distance of 2e away from the correct path.

The significance of LU(e) for soft-decision circular MAP decoding is that the probability of identifying a state on the actual transmitted path is high after the decoder processes LU(e) trellis stages. Therefore, the minimum wrap depth for circular MAP decoding is LU(e). Calculations of the depth LU(e) show that it is always larger than LF(e) but that it obeys the same approximate law. This implies that the minimum wrap depth can be estimated as the forward decision depth LF(e) if the unmerged decision depth of a code is not known.

By finding the minimum unmerged decision depth for a given encoder, we find the fewest number of trellis stages that must be processed by a practical circular decoder that generates soft-decision outputs. An algorithm to find LF(e), the forward decision depth, was given by J. B. Anderson and K. Balachandran in "Decision Depths of Convolutional Codes", cited hereinabove. To find LU(e):

(i) Extend the code trellis from left to right, starting from all trellis nodes simultaneously, except for the zero-state.

(ii) At each level, delete any paths that merge to the correct (all-zero) path; do not extend any paths out of the correct (zero) state node.

(iii) At level k, find the least Hamming distance, or weight, among paths terminating at nodes at this level.

(iv) If this least distance exceeds 2e, stop. Then, LU(e)=k.

Experimentation via computer simulation has lead to two unexpected results: (1) wrapped processing of $\beta_t$ improves decoder performance; and (2) the use of a wrap depth of LU(e)+LF(e)=2 LF(e) improves performance significantly. These unexpected results precipitated modifications of the circular MAP decoder for tail-biting trellis codes based on recursion. Hence, a preferred embodiment of the circular MAP decoder algorithm based on recursion comprises the following steps:

(i) Calculate $F_t$ for t=1, 2, ... L according to equation (2).

(ii) Starting with an initial $\alpha_0$ equal to (1/M, ..., 1/M), where M is the number of states in the trellis, calculate the forward recursion of equation (5) (L+$L_w$) times for u=1, 2, ... (L+$L_w$) where $L_w$ is the decoder's wrap depth. The trellis-level index t takes on the values ((u−1) mod L)+1. When the decoder wraps around the received sequence of symbols from the channel, $\alpha_L$ is treated as $\alpha_0$. Normalize the results so that the elements of each new $\alpha_t$ sum to unity. Retain the L most recent $\alpha$ vectors found via this recursion.

(iii) Starting with an initial $\beta_L$ equal to $(1, \ldots, 1)^T$, calculate the backward recursion of equation (6) (L+$L_w$) times for u=1, 2, ... (L+$L_w$). The trellis-level index t takes on the values L−(u mod L). When the decoder wraps around the received sequence, $\beta_1$ is used as $\beta_{L+1}$ and $\gamma_1$ is used as $\gamma_{L+1}$ when calculating the new $\beta_L$. Normalize the results so that the elements of each new $\beta_t$ sum to unity. Again, retain the L most recent $\beta$ vectors found via this recursion.

The next step of this preferred recursion method is the same as step (v) set forth hereinabove with respect to the eigenvector method to produce the soft-decisions and decoded bits output by the circular MAP decoder.

Figure 5:
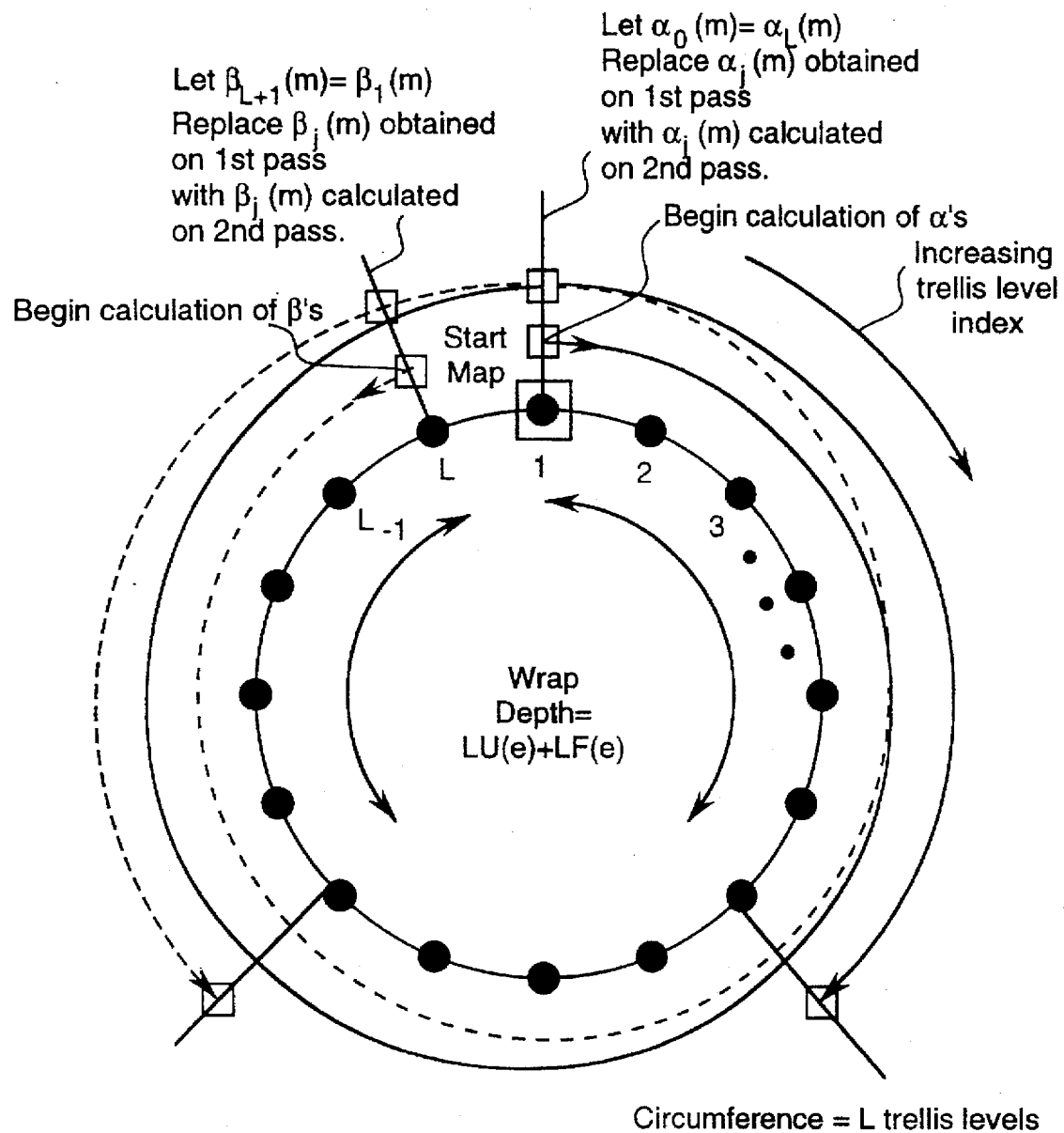
FIG. 5 illustrates a time line for a preferred embodiment of a circular MAP decoder in accordance with the present invention.

The circular "time line" of FIG. 5 summarizes the process for calculating the $\alpha_t$ and $\beta_t$ for u=1, 2, ..., (L+$L_w$) for the circular MAP decoder according to this preferred recursion method.

The performance of this preferred embodiment of the circular MAP decoder has been tested for the soft-decision, additive white Gaussian noise (AWGN) channel via computer simulation assuming binary antipodal signaling (e.g. binary phase shift keying). Simulations were run using the best-known rate=½, memory=6 convolutional code. (It is the best in the sense of having the largest free distance.) All simulation results presented herein were generated by a decoder that utilized a wrap depth equal to twice the forward decision depth of the code (40 trellis stages). Also, short message blocks comprising 48 bits were used in the simulations.

Figure 6:
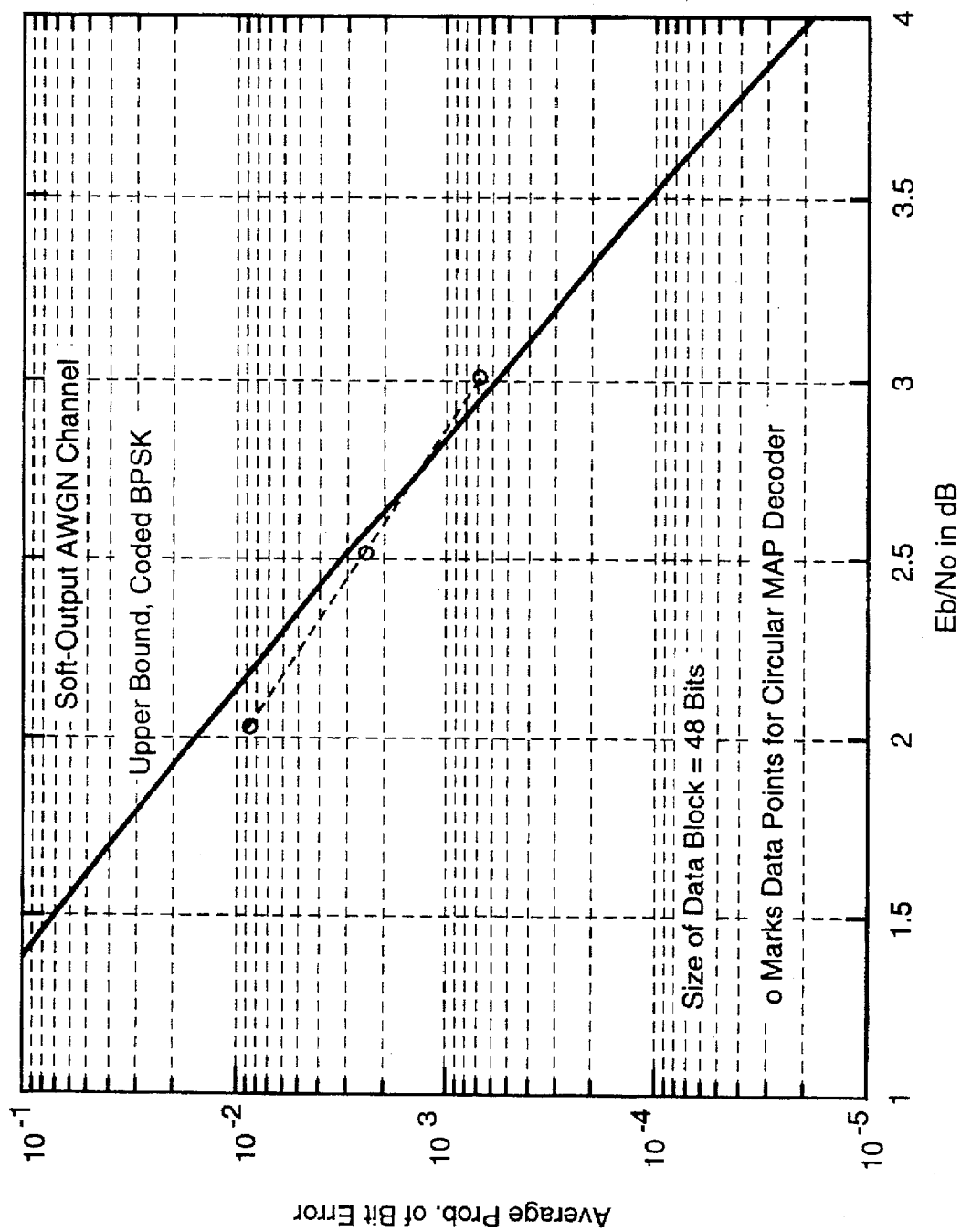
FIG. 6 graphically illustrates bit error rate versus signal-to-noise ratio for a circular MAP decoder when decoding a rate=½, memory=6 tail-biting convolutional code in accordance with the present invention.
Figure 7:
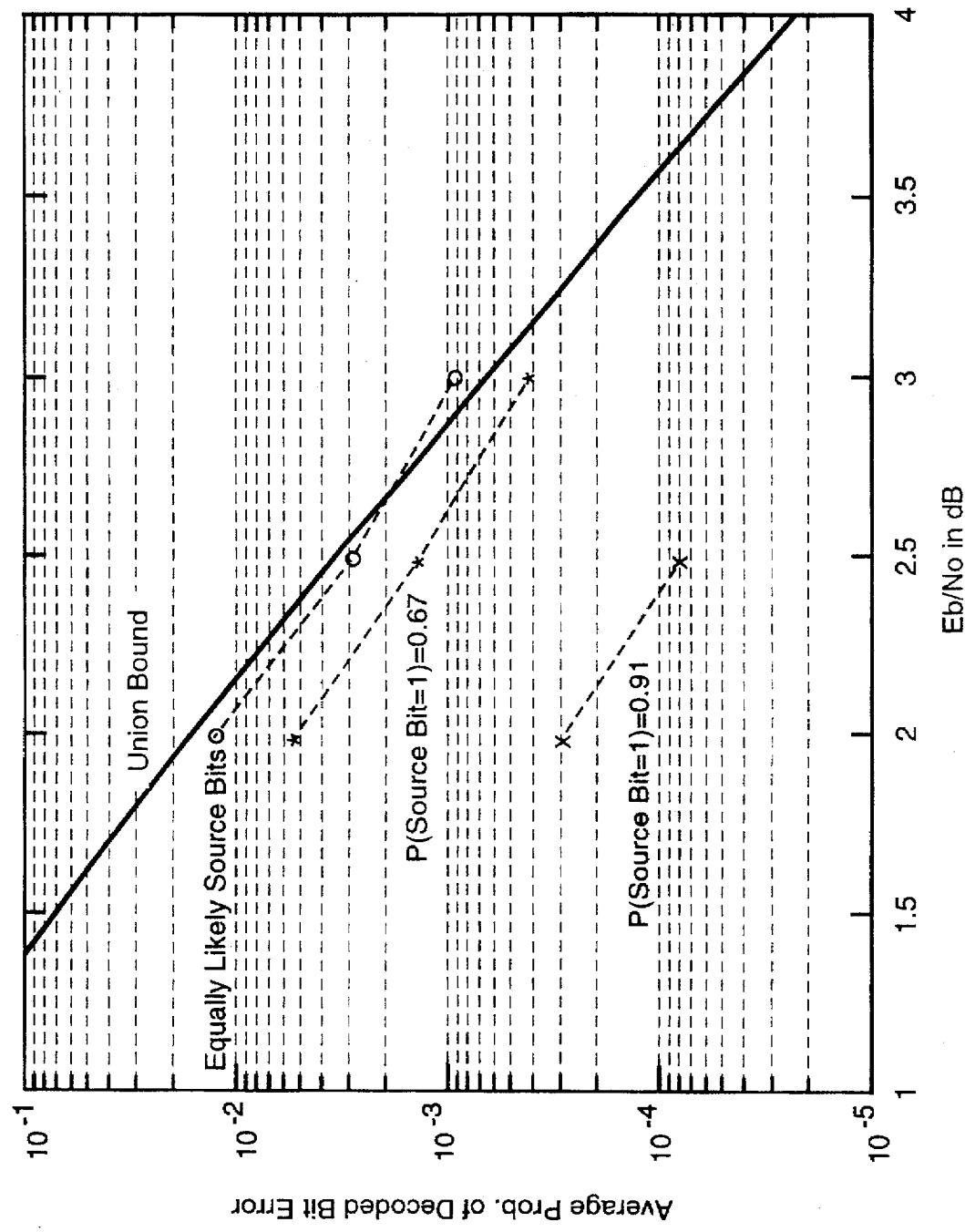
FIG. 7 graphically illustrates bit error rate versus signal-to-noise ratio with biased source statistics for a circular MAP decoder when decoding a rate=½, memory=6 tail-biting convolutional code in accordance with the present invention.

FIG. 6 is the resulting plot of average probability of decoded bit error versus $E_b/N_o$. The source bits were equally likely to be 0 or 1. However, when this simulation was repeated with biased source statistics that were known a priori by the decoder, the circular MAP decoder's average probability of bit error at a given $E_b/N_o$ decreased significantly. FIG. 7 compares bit error rate versus $E_b/N_o$ plots for the following three cases: equally likely source bits; P{source bit is 1}=0.67; and P{source bit is 1}=0.91. In the second case, P{source bit is 1}=2 P{source bit is 0}, while in the third case P{source bit is 1}=10 P{source bit is 0}.

Figure 8:
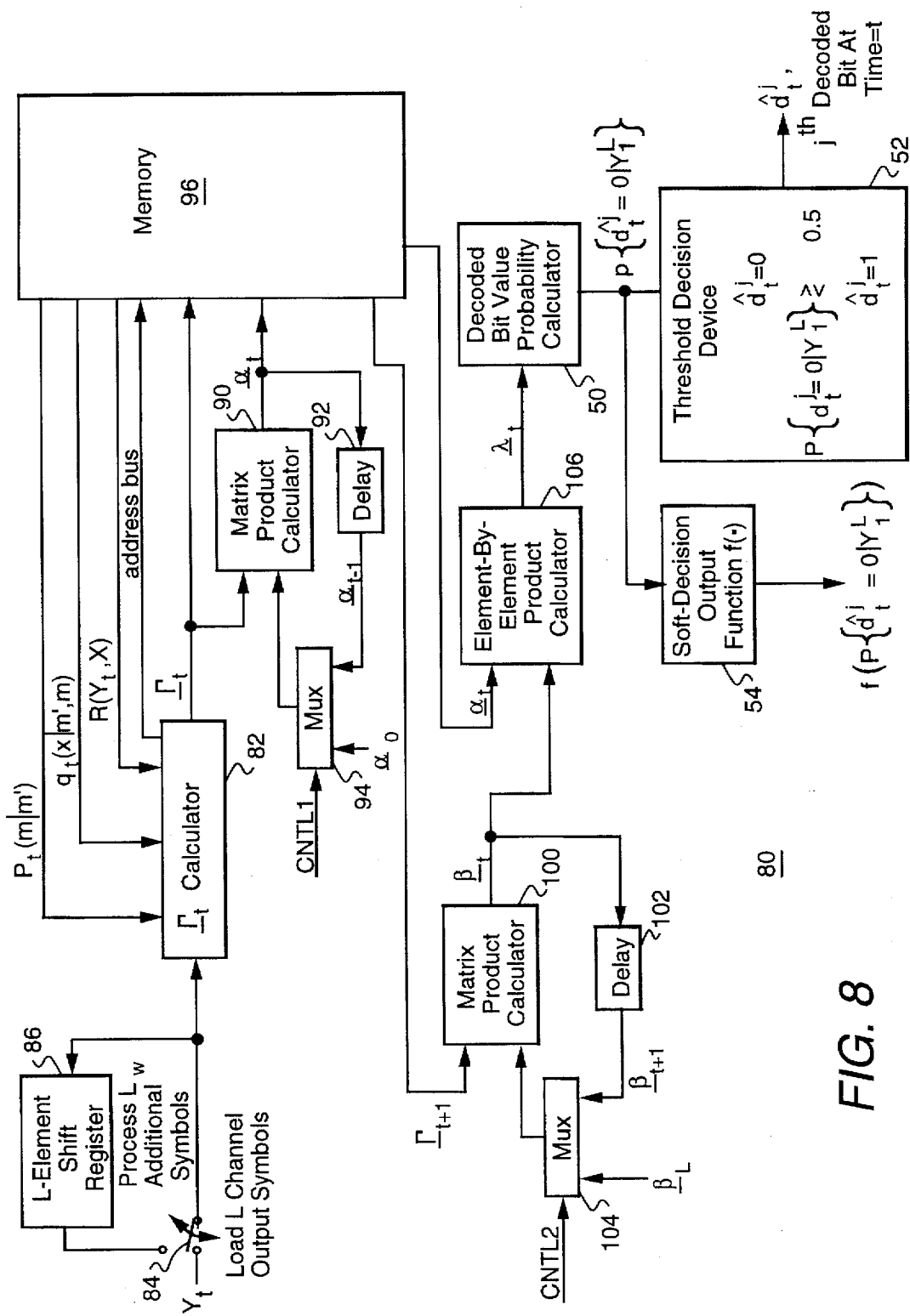
FIG. 8 is a simplified block diagram illustrating a preferred embodiment of a circular MAP decoder in accordance with the present invention.

FIG. 8 is a simplified block diagram illustrating a circular MAP decoder 80 in accordance with this preferred embodiment of the present invention. Decoder 80 comprises a $\gamma_t$ calculator 82 which calculates $\gamma_t$ as a function of the channel output $y_t$. The channel outputs $y_1, \ldots, y_L$ are provided to the $\gamma_t$ calculator via a switch 84. With the switch in the down position, L channel output symbols are loaded into a $\gamma_t$ calculator 82 and a shift register 86 one at a time. Then, switch 84 is moved to the up position to allow the shift register to shift the rust $L_w$ received symbols into the $\gamma_t$ calculator again, i.e., to provide circular processing. The $\gamma_t$ calculator receives as inputs from memory 96 the channel transition probability $R(Y_t, X)$, the probability $p_t(m/m')$ that the encoder makes a transition from state m' to m at time t, and the probability $q_t(X/m', m)$ that the encoder's output symbol is X given that the previous encoder state is m' and the present encoder state is m. The $\gamma_t$ calculator calculates each element of $\gamma_t$ by summing over all possible encoder outputs X in accordance with equation (2).

The calculated values of $\gamma_t$ are provided to a matrix product calculator 90 which multiplies the $\gamma_t$ matrix by the $\alpha_{t-1}$ matrix, which is provided recursively via a delay 92 and demultiplexer 94 circuit. Control signal CNTRL1 causes demultiplexer 94 to select $\alpha_0$ from memory 96 as one input to matrix product calculator 90 when t=1. When $2 \le t \le L$, control signal CNTRL1 causes demultiplexer 94 to select $\alpha_{t-1}$ from delay 92 as one input to matrix product calculator 90. Values of $\gamma_t$ and at are stored in memory 96 as required.

The $\beta_t$ vectors are calculated recursively in a matrix product calculator 100 via a delay 102 and multiplexer 104 circuit. Control signal CNTRL2 causes multiplexer 104 to select $\beta_L$ from memory 96 as one input to matrix product calculator 100 when t=L-1. When $L-2 \ge t \ge 1$, control signal CNTRL2 causes multiplexer 104 to select $\beta_{t+1}$ from delay 102 as one input to matrix product calculator 100. The resulting values of $\beta_t$ are multiplied by the values of $\alpha_t$ in an element-by-element product calculator 106 to provide the probabilities $\lambda_t$, as described hereinabove. In the same manner as described hereinabove with reference to FIG. 3, the values of $\lambda_t$ are provided to a decoded bit value probability calculator 50, the output of which is provided to a threshold decision device 52, resulting in the decoder's decoded output bits.

The probability that the decoded bit equals zero ($P\{d_t^j = 0/Y_1^L\}$) is also shown in FIG. 8 as being provided to a soft output function block 54 for providing a function of the probability, i.e., $f(P\{d_t^j=0/Y_t^j\})$, such as, for example, the $$\text{likelihood ratio} = \frac{1 - P\{d_t^j = 0/Y_t^j\}}{P\{d_t^j = 0/Y_1^L\}}$$

as the decoder's soft-decision output. Another useful function of $P\{d_t^j=0/Y_1^L\}$ is the $$\text{log likelihood ratio} = \log \left\{ \frac{1 - P\{d_t^j = 0/Y_1^L\}}{P\{d_t^j = 0\}} \right\}.$$

Alternatively, a useful function for block 54 may simply be the identity function so that the soft output is just $P\{d_t^j=0/Y_1^L\}$.

Several practical, powerful methods of coding depend critically on the MAP decoder's soft output information, e.g., methods of serial concatenated coding. In one such method in which the outer decoder utilizes errors and erasures decoding, the soft-decision output of a MAP inner decoder can be processed as an indicator of decoding reliability by a ternary-decision device that can assign the value 0 or 1 to a decoded bit or declare an erasure. In addition, soft decoder output can often be used to advantage by a following processor, such as a speech or image decoder. For example, the speech synthesizer of a vocoder can utilize the soft-decision outputs to identify likely transmission errors in a received speech frame in order to invoke error concealment methods to improve speech quality in equipment operating over very noisy channels.

Until the present invention, MAP decoding was not possible with tail-biting codes. The significance of tail-biting is that it extracts the ultimate error-correction performance from short codewords, for which it is difficult to obtain large coding gains. Short codewords naturally occur in packet data systems and voice communication systems with low-rate speech coding.

In addition, the present invention is useful in channels with fading or low-signal-to-noise power ratio which are common characteristics in very small aperture terminal (VSAT) satellite communications and mobile radio communications.

While the preferred embodiments of the present invention have been shown and described herein, it will be obvious that such embodiments are provided by way of example only. Numerous variations, changes and substitutions will occur to those of skill in the an without departing from the invention herein. Accordingly, it is intended that the invention be limited only by the spirit and scope of the appended claims.

What is claimed is:

1. A decoder for a tail-biting trellis code generated by an encoder, which decoder decodes by determining the joint probability that the state of the encoder at time t, $S_t$, is m and that a sequence of L channel outputs having values $Y_1^L = \{y_1, \ldots, y_L\}$ is received, as represented by $\lambda_t(m) = P\{S_t=m; Y_1^L\}$, said trellis code having M encoder states, said decoder determining L probability matrices $\gamma_t$, one at each of L trellis levels, the elements of said probability matrices being defined by:

$\gamma_t(ij) = P\{\text{state } j \text{ at time } t-1; y_t/\text{state } i \text{ at time } t_1\};$ by determining row vectors $\alpha_t$ having M joint probability elements defined by:

$\alpha_t(j) = P\{\text{state } j \text{ at time } t; y_1, \ldots, y_t\};$ and by determining column vectors $\beta_t$ having M conditional probability elements defined by:

$\beta_t(j) = P\{y_{t+1}, \ldots, y_L/\text{state } j \text{ at time } t\}$ for j=0, 1, . . . , (M-1), said decoder comprising:

a $\gamma_t$ calculator for receiving said channel outputs, the channel transition probability $R(Y_t, X)$, the probability $p_t(m/m')$ that the encoder makes a transition from state m' to m at time t, and the probability $q_t(X/m', m)$ that the encoder's output symbol is X given that the previous encoder state is m' and the present encoder state is m, and for determining the scalar elements of said probability matrices $\gamma_t$ therefrom;

a $\gamma_t$ matrix product calculator for receiving said scalar elements from said $\gamma_t$ calculator and computing a matrix product $\gamma_1 \gamma_2 \ldots \gamma_L$ therefrom;

a normalized eigenvector computer for receiving said matrix product $\gamma_1 \gamma_2 \ldots \gamma_L$ and computing a normalized eigenvector $\alpha_0$ corresponding to the largest eigenvalue $P\{Y_1^L\}$ of said matrix product;

a $\alpha_t$ matrix product calculator for receiving said normalized eigenvector $\alpha_0$ and forming the succeeding $\alpha_t$ by a forward recursion as follows:

$\alpha_t = \alpha_{t-1} \gamma_t, t=1, \ldots, L;$ memory for storing said probability matrices $\gamma_t$ and said row vectors $\alpha_t$;

a $\beta_t$ matrix product calculator for providing said column vectors by initializing $\beta_L = (1, 1, 1, \ldots, 1)^T$ and forming the preceding $\beta_t$ by a backward recursion as follows:

$\beta_t = \gamma_{t+1} \beta_{t+1}, t=L-1, \ldots, 1;$ an element-by-element product calculator for forming the joint probability vectors $\lambda t$, the elements of which are said joint probabilities $\lambda_t(ij)$, by multiplying the elements of said row vectors by the elements of said column vectors as follows:

$\lambda_t(i) = \alpha_t(i) \beta_t(i)$, all i, t=1, ..., L; and a decoded bit value probability calculator for determining from $\lambda_t$ the probability that a given data bit inputted to the encoder at time=t is equal to zero, the data bit being the $m^{th}$ of k data bits, and providing a soft output as a function of said probability.

2. The decoder of claim 1, further comprising a threshold decision device for receiving the probability that the data bit inputted to the encoder at time=t is equal to zero and for implementing a decision rule to provide decoded output bits therefrom.

3. The decoder of claim 1 wherein said tail-biting trellis code comprises a convolutional code.

4. The decoder of claim 1 comprising a bounded distance decoder.

5. A decoder for a tail-biting trellis code generated by an encoder, which decoder decodes by determining the joint probability that the state of the encoder at time t, $S_t$, is m and that a sequence of L channel outputs having values $Y_1^L = \{y_1, \ldots, y_L\}$ is received, as represented by $\lambda_t(m) = P\{S_t = m, Y_1^L\}$, said trellis code having M encoder states, said decoder determining L conditional probability matrices $\gamma_t$, one at each of L trellis levels, the elements of said probability matrices being defined by:

$\gamma_t(i,j) = P\{\text{state } j \text{ at time } t; y_t/\text{state } i \text{ at time } t-1\}$;

by determining row vectors $\alpha_t$ having M joint probability elements defined by:

$\alpha_t(j) = P\{\text{state } j \text{ at time } t; y_1, \ldots, y_t\}$;

and by determining column vectors $\beta_t$ having M conditional probability elements defined by:

$\beta_t(j) = P\{y_{t+1}, \ldots, y_L/\text{state } j \text{ at time } t\}$ for j=0, 1, ..., (M-1), said decoder comprising:

a $\gamma_t$ calculator for receiving said channel outputs, the channel transition probability $R(Y_t, X)$, the probability $p_t(m/m')$ that the encoder makes a transition from state m' to m at time t, and the probability $q_t(X/m', m)$ that the encoder's output symbol is X given that the previous encoder state is m' and the present encoder state is m, and for determining the scalar elements of said probability matrices $\gamma_t$ therefrom;

a $\alpha_t$ matrix product calculator for receiving said scalar elements of $\gamma_t$ from said $\gamma_t$ calculator and providing said row vectors $\alpha_t$;

a $\beta_t$ matrix product calculator for providing said column vectors $\beta_t$;

an element-by-element product calculator for forming the joint probability vectors $\lambda_t$, the elements of which are said joint probabilities $\lambda_t(i,j)$;

said $\alpha_t$ matrix product calculator, said $\beta_t$ matrix product calculator, and said element-by-element product calculator forming said vectors $\alpha_t$, $\beta_t$, and $\lambda_t$, respectively, by:

(i.a) starting with an initial $\alpha_0$ equal to (1/M, ..., 1/M), calculating L times the forward recursion:

$\alpha_t = \alpha_{t-1} \gamma_t$, t=1, ..., L;

and normalizing the results so that the elements of each $\alpha_t$ sum to unity, retaining all L $\alpha_t$ vectors;

(i.b) letting $\alpha_0$ equal $\alpha_L$ from step (i.a) and, starting at t =1, calculating $\alpha_t = \alpha_{t-1} \gamma_t$, t=1, ..., $L_{w_{min}}$;

where $L_{w_{min}}$ is a predetermined minimum number of trellis stages; normalizing the results so that the elements of each $\alpha_t$ sum to unity, retaining only the most recent set of $\alpha_t$'s found by the recursion in steps (i.a) and (i.b) and the $\alpha_{L_{w_{min}}}$ found in step (i.a);

(i.c) comparing $\alpha_{L_{w_{min}}}$ from step (i.b) to the $\alpha_{L_{w_{min}}}$ found in step (i.a) and proceeding to step (ii) if within a tolerance range; otherwise, continuing to step (i.d);

(i.d) letting t=t+1 and calculating $\alpha_t = \alpha_{t-1} \beta_t$, normalizing the results of the recursion so that the elements of each $\alpha_t$ sum to unity, retaining only the most recent set of L $\alpha_t$'s calculated and this $\alpha_t$ found previously in step (i.a).

(i.e) comparing the $\alpha_t$ to the most recent, previously-calculated $\alpha_t$ from steps (i.a), (i.b) and (i.d) and proceeding to step (ii) if within a tolerance range, continuing with step (i.d) if the two most recent vectors do not agree to within said tolerance range and if the number of recursions does not exceed a predetermined maximum; proceeding to step (ii) otherwise;

(ii) initializing $\beta_L = (1, 1, 1, \ldots, 1)^T$ and forming the preceding $\beta_t$ by a backward recursion as follows:

$\beta_t = \gamma_{t+1} \beta_{t+1}$, t=L-1, ..., 1;

and normalizing the results of the recursion so that the elements of each $\beta_t$ sum to unity, retaining all L $\beta_t$ vectors;

(iii) forming the joint probability vectors $\lambda_t$, the elements of which are said joint probabilities $\lambda_t$, by multiplying the elements of said row vectors by the elements of said column vectors as follows:

$\lambda_t(i) = \alpha_t(i) \beta_t(i)$, all i, t=1, ..., L;

memory for storing said probability matrices and said row vectors; and a decoded bit value probability calculator for determining from $\lambda_t$ the probability that a given data bit inputted to the encoder at time=t is equal to zero, the data bit being the $m^{th}$ of k data bits, and providing a soft output as a function of said probability.

6. The decoder of claim 5, further comprising a threshold decision device for receiving the probability that the data bit inputted to the encoder at time=t is equal to zero and for implementing a decision rule to provide decoded output bits therefrom.

7. The decoder of claim 5 wherein said tail-biting trellis code comprises a convolutional code.

8. The decoder of claim 5 comprising a bounded distance decoder.

9. The decoder of claim 5 wherein the encoder encodes a block of data bits, said data bits being grouped into k-bit symbols for encoding, the predetermined maximum number of recursions comprising two times the number of k-bit input symbols in a block of data bits.

10. A decoder for a tail-biting trellis code generated by an encoder, which decoder decodes by determining the joint probability that the state of the encoder at time t, $S_t$, is m and that a sequence of L channel outputs having values $Y_1^L = \{y_1, \ldots, y_L\}$ is received, as represented by $\lambda_t(m) = P\{S_t = m; Y_1^L\}$, said trellis code having M encoder states, said decoder determining L conditional probability matrices $\gamma_t$, one at each of L trellis levels, the elements of said probability matrices being defined by:

$$\gamma_t(ij) = P\{\text{state } j \text{ at time } t; y_t/\text{state } i \text{ at time } t-1\};$$

by determining row vectors $\alpha_t$ having M joint probability elements defined by:

$$\alpha_t(j) = P\{\text{state } j \text{ at time } t; y_1, \ldots, y_t\};$$

and by determining column vectors $\beta_t$ having M conditional probability elements defined by:

$$\beta_t(j) = P\{y_{t+1}, \ldots, y_L/\text{state } j \text{ at time } t\}$$

for $j = 0, 1, \ldots, (M-1)$, said decoder comprising:

a $\gamma_t$ calculator for receiving said channel outputs, the channel transition probability $R(Y_t, X)$, the probability $p_t(m/m')$ that the encoder makes a transition from state m' to m at time t, and the probability $q_t(X/m', m)$ that the encoder's output symbol is X given that the previous encoder state is m' and the present encode state is m, and for determining the scalar elements of said probability matrices $\gamma_t$ therefrom;

a $\alpha_t$ matrix product calculator for receiving said scalar elements of $\gamma_t$ from said $\gamma_t$ calculator and providing said row vectors $\alpha_t$;

a $\alpha_t$ matrix product calculator for providing said column vectors $\beta_t$;

an element-by-element product calculator for forming the joint probability $\lambda_t$;

said $\alpha_t$ matrix product calculator, said $\beta_t$ matrix product calculator, and said element-by-element product calculator forming said vectors $\alpha_t$, $\beta_t$ and $\lambda_t$, respectively, by:

(i.a) starting with an initial $\alpha_0$ equal to $(1/M, \ldots, 1/M)$, calculating L times the forward recursion:

$$\alpha_t = \alpha_{t-1}\gamma_t, t = 1, \ldots, L;$$

and normalizing the results so that the elements of each $\alpha_t$ sum to unity, retaining all $\alpha_t$ vectors;

(i.b) letting $\alpha_0$ equal $\alpha_L$ from step (i.a) and, starting at t = 1, calculating $$\alpha_t = \alpha_{t-1}\gamma_t, \text{ for } t = 1, 2, \ldots L_w;$$

where the wrap depth $L_w$ is a predetermined number of trellis stages; normalizing the results so that the elements of each $\alpha_t$ sum to unity, replacing the $\alpha_t$ calculated in step (i.a) with the $\alpha_t$ calculated in step (i.b) for $t = 1, 2, \ldots, L_w$;

(ii.a) initializing $\beta_L = (1, 1, 1, \ldots, 1)^T$ and forming the preceding $\beta_t$ by a backward recursion as follows:

$$\beta_t = \gamma_{t+1}\beta_{t+1}, t = L-1, \ldots, 1;$$

and normalizing the results of the recursion so that the elements of each $\beta_t$ sum to unity, retaining all L $\beta_t$ vectors;

(ii.b) letting $\beta_{L+1}$ equal $\beta_1$ from step (ii.a) and letting $\gamma_{L+1} = \gamma_1$, starting at t=L, and calculating $$\beta_t = \gamma_{t+1}\beta_{t+1} \text{ for } t = L, (L-1), \ldots (L-L_w)$$

where the wrap depth $L_w$ is a predetermined number of trellis stages; normalizing the results of the recursions so that the elements of each $\beta_t$ sum to unity, replacing the $\beta_t$ calculated in step (ii.a) with the $\beta_t$ calculated in step (ii.b) for $t = L, (L-1), \ldots, L-(L_w+1)$;

(iii) forming the joint probability vectors $\lambda_t$, the elements of which are said joint probabilities $\lambda_t(ij)$, by multiplying the elements of said row vectors by the elements of said column vectors as follows:

$$\lambda_t(i) = \alpha_t(i)\beta_t(i), \text{ all } i, t = 1, \ldots, L;$$

memory for storing said probability matrices and said row vectors; and a decoded bit value probability calculator for determining from $\lambda_t$ the probability that a given data bit inputted to the encoder at time=t is equal to zero, the data bit being the $m^{th}$ of k data bits, and providing a soft output as a function of said probability.

11. The decoder of claim 10, further comprising a threshold decision device for receiving the probability that the data bit inputted to the encoder at time=t is equal to zero and for implementing a decision rule to provide decoded output bits therefrom.

12. The decoder of claim 10 wherein said tail-biting trellis code comprises a convolutional code.

13. The decoder of claim 10 comprising a bounded distance decoder.

14. The decoder of claim 10 wherein the encoder encodes a block of data bits, said data bits being grouped into k-bit symbols for encoding, the predetermined maximum number of recursions comprising two times the number of k-bit input symbols in a block of data bits.

15. A method for decoding a tail-biting trellis code generated by an encoder by determining the joint probability that the state of the encoder at time t, $S_t$, is m and that a sequence of L channel outputs having values $Y_1^L = \{y_1, \ldots, y_L\}$ is received, as represented by $\lambda_t(m) = P\{S_t = m; Y_1^L\}$, said trellis code having M encoder states, said method comprising steps for determining L probability matrices $\gamma_t$, one at each of L trellis levels, the elements of said probability matrices being defined by:

$$\gamma_t(ij) = P\{\text{state } j \text{ at time } t; y_t/\text{state } i \text{ at time } t-1\};$$

and for determining row vectors $\alpha_t$ having M joint probability elements defined by:

$$\alpha_t(j)=P\{\text{state } j \text{ at time } t; y_1, \ldots, y_t\};$$

and for determining column vectors $\beta_t$ having M conditional probability elements defined by:

$$\beta_t(j)=P\{y_{t+1}, \ldots y_L/\text{state } j \text{ at time } t\}$$

for $j=0, 1, \ldots, (M-1)$, the steps of said method comprising:
- determining the scalar elements of said probability matrices $\gamma_t$ from said channel outputs, the channel transition probability $R(Y_t, X)$, the probability $p_t(m/m')$ that the encoder makes a transition from state m' to m at time t, and the probability $q_t(X/m', m)$ that the encoder's output symbol is X given that the previous encoder state is m' and the present encoder state is m;
- computing a matrix product $\gamma_1 \gamma_2 \ldots \gamma_L$ from said scalar elements of $\gamma_t$;
- computing a normalized eigenvector $\alpha_0$ corresponding to the largest eigenvalue $P\{Y_1^L\}$ of said matrix product $\gamma_1 \gamma_2 \ldots \gamma_L$;
- forming the succeeding $\alpha_t$ by a forward recursion as follows:

$$\alpha_t=\alpha_{t-1} \gamma_t, t=1, \ldots, L;$$

- providing said column vectors by initializing $\beta_L=(1, 1, 1, \ldots, 1)^T$ and forming the preceding $\beta_t$ by a backward recursion as follows:

$$\beta_t=\gamma_{t+1} \beta_{t+1}, t=L-1, \ldots, 1;$$

- forming the joint probability vectors $\lambda_t$, the elements of which are said joint probabilities $\lambda_t(ij)$, by multiplying the elements of said row vectors by the elements of said column vectors as follows:

$$\lambda_t(i)=\alpha_t(i) \beta_t(i), \text{ all } i, t=1, \ldots, L; \text{ and}$$

- determining from $\lambda_t$ the probability that a given data bit inputted to the encoder at time=t is equal to zero, the data bit being the $m^{th}$ of k data bits, and providing a soft output as a function of said probability.

16. The method of claim 15, further comprising the step of implementing a decision role to provide decoded output bits from the probability that the dam bit inputted to the encoder at time=t is equal to zero.

17. The method of claim 15 wherein said tail-biting trellis code comprises a convolutional code.

18. A method for decoding a tail-biting trellis code generated by an encoder by determining the joint probability that the state of the encoder at time t, $S_t$, is m and that a sequence of L channel outputs having values $Y_1^L=\{y_1, \ldots, y_L\}$ is received, as represented by $\lambda_t(m)=P\{S_t=m; Y_1^L\}$, said trellis code having M encoder states, said method comprising steps for determining L probability matrices $\gamma_t$, one at each of L trellis levels, the elements of said probability matrices being defined by:

$$\gamma_t(ij)=P\{\text{state } j \text{ at time } t-1; y_t/\text{state } i \text{ at time } t-1\};$$

and for determining row vectors $\alpha_t$ having M joint probability elements defined by:

$$\alpha_t(j)=P\{\text{state } j \text{ at time } t; y_1, \ldots, y_t\};$$

and for determining column vectors $\beta_t$ having M conditional probability elements defined by:

$$\beta_t(j)=P\{y_{t+1}, \ldots y_L/\text{state } j \text{ at time } t\}$$

for $j=0, 1, \ldots, (M-1)$, the steps of said method comprising:
- determining the scalar elements of said probability matrices $\gamma_t$ from said channel outputs, the channel transition probability $R(Y_t, X)$, the probability $p_t(m/m')$ that the encoder makes a transition from state m' to m at time t, and the probability $q_t(X/m', m)$ that the encoder's output symbol is X given that the previous encoder state is m' and the present encoder state is m;
- forming said vectors $\alpha_t$, $\beta_t$, and $\lambda_t$, respectively, by:
    (i.a) starting with an initial $\alpha_0$ equal to $(1/M, \ldots, 1/M)$, calculating L times the forward recursion:

$$\alpha_t=\alpha_{t-1} \gamma_t, t=1, \ldots, L;$$

and normalizing the results so that the elements of each $\alpha_t$ sum to unity, retaining all L $\alpha_t$ vectors;

(i.b) letting $\alpha_0$ equal $\alpha_L$ from step (i.a) and, starting at $t=1$, calculating $$\alpha_t=\alpha_{t-1} \gamma_t, \text{ for } t=1, 2, \ldots, L_{w_{min}}$$

where $L_{w_{min}}$ is a predetermined minimum number of trellis stages; normalizing the results so that the elements of each $\alpha_t$ sum to unity, retaining only the most recent set of L $\alpha_t$'s found by the recursion in steps (i.a) and (i.b) and the $$\alpha_{L_{w_{min}}}$$

found in step (i.a);

(i.c) comparing $$\alpha_{L_{w_{min}}}$$

from step (i.b) to the $$\alpha_{L_{w_{min}}}$$

found in step (i.a) and proceeding to step (ii) if within a tolerance range; otherwise, continuing to step (i.d);

(i.d) letting $t=t+1$ and calculating $\alpha_t=\alpha_{t-1} \gamma_t$, normalizing the results of the iteration so that the elements of each $\alpha_t$ sum to unity, retaining only the most recent set of L $\alpha$'s calculated and this $\alpha_t$ found previously in step (i.a).

(i.e) comparing the $\alpha_t$ to the most recent, previously-calculated $\alpha_t$ from steps (i.a), (i.b) and (i.d) and proceeding to step (ii) if within a tolerance range, continuing with step (i.d) if the two most recent vectors do not agree to within said tolerance range and if the number of recursions does not exceed a predetermined maximum; proceeding to step (ii) otherwise;

(ii) initializing $\beta_L=(1, 1, 1, \ldots, 1)^T$ and forming the preceding $\beta_t$ by a backward recursion as follows:

$$\beta_t = \gamma_{t+1} \beta_{t+1}, \ t=L-1, \ldots, 1;$$

and normalizing the results of the recursion so that the elements of each $\beta_t$ sum to unity, retaining all L $\beta_t$ vectors;

(iii) forming the joint probability $\lambda_t$ vectors, the elements of which are said joint probabilities $\lambda_t(i, j)$ by multiplying the elements of said row vectors by the elements of said column vectors as follows:

$$\lambda_t(i) = \alpha_t(i) \beta_t(i), \text{ all } i, \ t=1, \ldots, L; \text{ and}$$

determining from $\lambda_t$ the probability that a given data bit inputted to the encoder at time=t is equal to zero, the data bit being the $m^{th}$ of k data bits, and providing a soft output as a function of said probability.

19. The method of claim 18 further comprising the step of implementing a decision rule to provide decoded output bits from the probability that the data bit inputted to the encoder at time=t is equal to zero.

20. The method of claim 18 wherein said tail-biting trellis code comprises a convolutional code.

21. The method of claim 18 wherein the encoder encodes a block of data bits, said data bits being grouped into k-bit symbols for encoding, the predetermined maximum number of recursions comprising two times the number of k-bit input symbols in a block of data bits.

22. A method for decoding a tail-biting trellis code generated by an encoder by determining the joint probability that the state of the encoder at time t, $S_t$, is m and that a sequence of L channel outputs having values $Y_1^L = \{y_1, \ldots, y_L\}$ is observed, as represented by $\lambda_t(m) = P\{S_t=m; Y_1^L\}$, said trellis code having M encoder states, said method comprising steps for determining L conditional probability matrices $\gamma_t$, one at each of L trellis levels, the elements of said probability matrices being defined by:

$$\gamma_t(ij) = P\{\text{state } j \text{ at time } t; \ y_t/\text{state } i \text{ at time } t-1\};$$

and for determining row vectors $\alpha_t$ having M joint probability elements defined by:

$$\alpha_t(j) = P\{\text{state } j \text{ at time } t; \ y_1, \ldots, y_t\};$$

and for determining column vectors $\beta_t$ having M conditional probability elements defined by:

$$\beta_t(j) = P\{y_{t+1}, \ldots, y_L/\text{state } j \text{ at time } t\}$$

for $j=0, 1, \ldots, (M-1)$, the steps of said method comprising:

determining the scalar elements of said probability matrices $\gamma_t$ from said channel outputs, the channel transition probability $R(Y_t, X)$, the probability $p_t(m/m')$ that the encoder makes a transition from state m' to m at time t, and the probability $q_t(X/m', m)$ that the encoder's output symbol is X given that the previous encoder state is m' and the present encoder state is m;

forming said vectors $\alpha_t$, $\beta_t$, and $\lambda_t$, respectively, by:

(i.a) starting with an initial $\alpha_0$ equal to $(1/M, \ldots, 1/M)$, calculating L times the forward recursion:

$$\alpha_t = \alpha_{t-1} \gamma_t, \ t=1, \ldots, L;$$

and normalizing the results so that the elements of each $\alpha_t$ sum to unity, retaining all L $\alpha_t$ vectors;

(i.b) letting $\alpha_0$ equal $\alpha_L$ from step (i.a) and, starting at $t=1$, calculating $$\alpha_t = \alpha_{t-1} \gamma_t, \text{ for } t=1, \ldots L_w,$$

where the wrap depth $L_w$ is a predetermined number of trellis stages; normalizing the results so that the elements of each $\alpha_t$ sum to unity, replacing the $\alpha_t$ calculated in step (i.a) with the $\alpha_t$ calculated in step (i.b) for $t=1, 2, \ldots L_w$;

(ii.a) initializing $\beta_L=(1, 1, 1, \ldots, 1)^T$ and forming the preceding $\beta_t$ by a backward recursion as follows:

$$\beta_t = \gamma_{t+1} \beta_{t+1}, \ t=L-1, \ldots, 1;$$

and normalizing the results of the recursion so that the elements of each $\beta_t$ sum to unity, retaining all L $\beta_t$ vectors;

(ii.b) letting $\beta_{L+1}$ equal $\beta_1$ from step (ii.a) and letting $\gamma_{L+1} = \gamma_1$, starting at $t=L$, and calculating $$\beta_t = \gamma_{t+1} \beta_{t+1}, \text{ for } t=L, (L-1), \ldots (L-L_w);$$

where the wrap depth $L_w$ is a predetermined number of trellis stages; normalizing the results so that the elements of each $\beta_t$ sum to unity, replacing the $\beta_t$ calculated in step (ii.a) with the $\beta_t$ calculated in step (ii.b) for $t=L, (L-1), \ldots, L-(L_w+1)$;

(iii) forming the joint probability $\lambda_t$ vectors, the elements of which are said joint probabilities $y_t$, by multiplying the elements of said row vectors by the elements of said column vectors as follows:

$$\lambda_{(i)} = \alpha_t(i) \beta_t(i), \text{ all } i, \ t=1, \ldots, L; \text{ and}$$

determining from $\lambda_t$ the probability that a given data bit inputted to the encoder at time=t is equal to zero, the data bit being the $m^{th}$ of k data bits, and providing a soft output as a function of said probability.

23. The method of claim 22, further comprising the step of implementing a decision rule to provide decoded output bits from the probability that the data bit inputted to the encoder at time =t is equal to zero.

24. The method of claim 22 wherein said tail-biting trellis code comprises a convolutional code.

25. The method of claim 22 wherein the encoder encodes a block of data bits, said data bits being grouped into k-bit symbols for encoding, the predetermined maximum number of recursions comprising two times the number of k-bit input symbols in a block of data bits.

* * * * *